United States Patent
Lee et al.

(10) Patent No.: US 9,252,784 B2
(45) Date of Patent: Feb. 2, 2016

(54) DEVICE AND METHOD FOR CONTROLLING OUTPUT AMPLITUDE OF VOLTAGE CONTROL OSCILLATOR IN ELECTRONIC DEVICE

(71) Applicant: Samsung Electronics Co., Ltd., Suwon-si, Gyeonggi-do (KR)

(72) Inventors: Joon-Hee Lee, Goyang-si (KR); Jong-Won Choi, Seongnam-si (KR); Young-Taek Lee, Seongnam-si (KR); Byung-Hak Cho, Seongnam-si (KR); Young-Gun Pu, Jeju-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/488,884

(22) Filed: Sep. 17, 2014

(65) Prior Publication Data
US 2015/0130542 A1    May 14, 2015

(30) Foreign Application Priority Data
Nov. 12, 2013    (KR) .................. 10-2013-0137011

(51) Int. Cl.
H03L 5/00 (2006.01)
H03L 7/093 (2006.01)
H03B 5/08 (2006.01)
H03L 7/00 (2006.01)
H03L 7/099 (2006.01)

(52) U.S. Cl.
CPC .. *H03L 5/00* (2013.01); *H03B 5/08* (2013.01); *H03L 7/00* (2013.01); *H03L 7/093* (2013.01); *H03L 7/099* (2013.01)

(58) Field of Classification Search
CPC ....... H03L 7/0995; H03L 7/105; H03L 7/235; H03L 7/099; H03L 7/093; H03L 5/00; H03L 7/00; H03B 5/08
USPC ..................... 331/16, 34, 167, 175, 182, 183
See application file for complete search history.

(56) References Cited

U.S. PATENT DOCUMENTS

| | | | |
|---|---|---|---|
| 7,123,113 B1 * | 10/2006 | Brennan et al. | ............... 331/158 |
| 2006/0145771 A1 | 7/2006 | Strange | |
| 2006/0158271 A1 | 7/2006 | Juang et al. | |
| 2007/0049212 A1 | 3/2007 | Dunworth et al. | |
| 2011/0057732 A1 | 3/2011 | Taylor et al. | |

FOREIGN PATENT DOCUMENTS

| | | |
|---|---|---|
| JP | 2011-082744 A | 4/2011 |
| KR | 10-2008-0024896 A | 3/2008 |

* cited by examiner

*Primary Examiner* — Arnold Kinkead
(74) *Attorney, Agent, or Firm* — Jefferson IP Law, LLP (57) ABSTRACT

An electronic device and a method for control of an output amplitude of a Voltage Control Oscillator (VCO) in the electronic device is provided. The electronic device includes a first circuit configured to output a frequency signal corresponding to a control voltage, and a second circuit configured to generate control bits that control an amplitude of the frequency signal based on a comparison result between a peak voltage of the frequency signal and a reference voltage of the frequency signal.

21 Claims, 12 Drawing Sheets

DEVICE AND METHOD FOR CONTROLLING OUTPUT AMPLITUDE OF VOLTAGE CONTROL OSCILLATOR IN ELECTRONIC DEVICE

CROSS-REFERENCE TO RELATED APPLICATION(S)

This application claims the benefit under 35 U.S.C. §119 (a) of a Korean patent application filed on Nov. 12, 2013 in the Korean Intellectual Property Office and assigned Serial number 10-2013-0137011, the entire disclosure of which is hereby incorporated by reference.

TECHNICAL FIELD

The present disclosure relates to an output control of a Voltage Control Oscillator (VCO) in an electronic device.

BACKGROUND

An electronic device is formed with many circuits. Particularly, an electronic device for communication may include a Radio Frequency (RF) circuit for controlling RF, and the RF circuit generally includes a frequency synthesizer that generates a sine wave signal and/or a RF signal. In a partial configuration of the frequency synthesizer, a block that generates a signal of a desired frequency is referred to as a Voltage Control Oscillator (VCO).

An amplitude of an output signal of the VCO may be changed according to a quantity of a consumption current of the VCO. A consumption current of the VCO may be generally changed according to a process deviation and capacitance of the VCO. Therefore, in order to constantly maintain an amplitude magnitude of an output signal of the VCO to a desired value, it is needed to optimize a current. According to a method of controlling a current of a related-art VCO, an output amplitude magnitude of the VCO is compared with a reference voltage, and an analog feedback loop method of adjusting a gate voltage of a transistor that operates with a current source of the VCO according to a comparison result is generally used.

In an analog component, such as an Operational Amplifier (OP-AMP) and a comparator frequently used in the above-described feedback loop method, a gain, an operation speed, and a bandwidth may be easily changed according to a process change. Therefore, when each analog component performs a stable operation in spite of a process change, an output voltage of the VCO may be accurately controlled. Therefore, high design completeness of an analog circuit constituting the feedback loop as well as a design of the VCO is needed.

Further, when using the analog feedback loop, in order to measure an output voltage of the VCO, each analog component should always operate. Thereby, additional current consumption, other than a consumption current of the VCO, increases and thus it is very difficult to optimize a current of the VCO. Further, phase noise of the VCO may be deteriorated by noise generated by the analog components. Further, in analog circuits, when an existing process is changed to a new process, e.g., when a 180 nm Complementary metal-oxide-semiconductor (CMOS) process is changed to a 65 nm CMOS process, a performance is greatly changed and thus a feedback loop appropriate thereto should be again designed.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a device and method for controlling an output of a Voltage Control Oscillator (VCO) in an electronic device.

Another aspect of the present disclosure is to provide a device and method for maintaining an amplitude of an output signal of a VCO to a desired value in an electronic device.

Another aspect of the present disclosure is to provide a device and method for adjusting a current quantity supplied to a VCO in an electronic device.

Another aspect of the present disclosure is to provide a device and method for decreasing a current consumption quantity due to an output control circuit of a VCO in an electronic device.

In accordance with an aspect of the present disclosure, an electronic device is provided. The electronic device includes a first circuit configured to output a frequency signal corresponding to a control voltage, and a second circuit configured to generate control bits that control an amplitude of the frequency signal based on a comparison result between a peak voltage of the frequency signal and a reference voltage of the frequency signal, wherein the first circuit is further configured to adjust an amplitude of the frequency signal according to the control bits.

In accordance with another aspect of the present disclosure, a method of operating an electronic device is provided. The method includes outputting a frequency signal corresponding to a control voltage, generating control bits that control an amplitude of the frequency signal based on a comparison result between a peak voltage of the frequency signal and a reference voltage of the frequency signal, and adjusting an amplitude of the frequency signal according to the control bits.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Hereinafter, technology that controls an output of a Voltage Control Oscillator (VCO) in an electronic device according to an embodiment of the present disclosure will be described.

Figure 1:
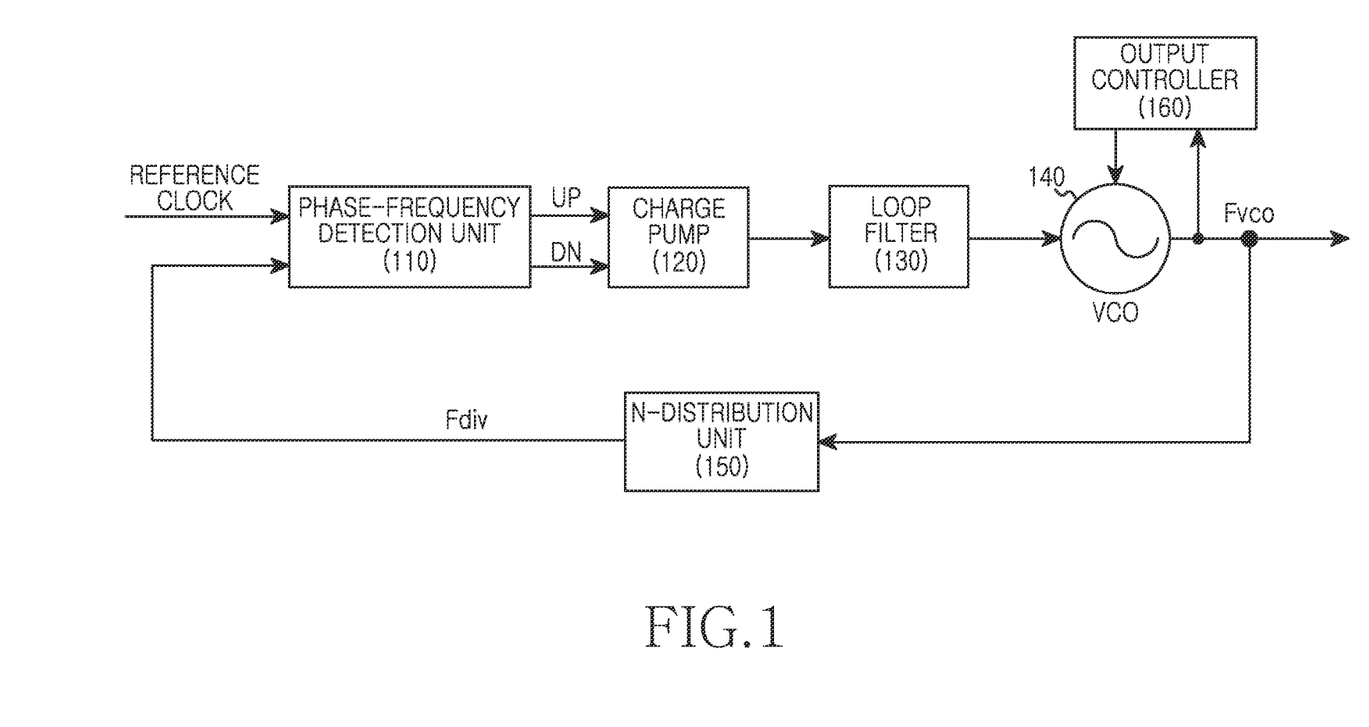
FIG. 1 is a block diagram illustrating a configuration of an electronic device according to an embodiment of the present disclosure.

FIG. 1 is a block diagram illustrating a configuration of an electronic device according to an embodiment of the present disclosure.

Referring to FIG. 1, the electronic device includes a phase-frequency detection unit 110, a charge pump 120, a loop filter 130, a VCO 140, an N-distribution unit 150, and an output controller 160.

The phase-frequency detection unit 110 receives a reference clock and a feedback signal Fdiv from the N-distribution unit 150 and determines whether a frequency difference and a phase difference exist between the reference clock and the feedback signal Fdiv. The phase-frequency detection unit 110 outputs one of an up-signal UP and a down-signal DN based on the reference clock and the feedback signal Fdiv. That is, the phase-frequency detection unit 110 compares phases of the reference clock and the feedback signal Fdiv and outputs one of the up-signal UP and the down-signal DN according to the comparison result. Specifically, if a phase of the reference clock is faster than that of the feedback signal Fdiv, the phase-frequency detection unit 110 outputs the up-signal UP, and if a phase of the reference clock is slower than that of the feedback signal Fdiv, the phase-frequency detection unit 110 outputs the down-signal DN.

The charge pump 120 supplies a specific quantity of electric charges to the loop filter 130 or collects a specific quantity of electric charges from the loop filter 130 based on the signal output from the phase-frequency detection unit 110. Because the charge pump 120 should rise or drop a voltage according to the difference between the reference clock and the feedback signal in a reference voltage value, the charge pump 120 performs two branch operations. That is, when raising a voltage, the charge pump 120 supplies electric charges, and when dropping a voltage, the charge pump 120 collects electric charges. In other words, when inputting the up-signal, the charge pump 120 supplies electric charges, and when inputting the down-signal, the charge pump 120 collects electric charges.

The loop filter 130 accumulates and discharges electric charges supplied or collected from the charge pump 120. In this case, an electric charge quantity accumulated within the loop filter 130 is changed by the charge pump 120. For example, the loop filter 130 may have a Low-Pass Filter (LPF) form. The loop filter 130 applies a control voltage to the VCO 140. That is, the loop filter 130 changes a control voltage of the VCO 140.

The VCO 140 outputs a signal of a frequency corresponding to a control voltage. That is, the VCO 140 outputs a signal of a frequency corresponding to a voltage input from the loop filter 130. Further, according to an embodiment of the present disclosure, the VCO 140 adjusts a current supply quantity and an output amplitude according to the control of the output controller 160.

The N-distribution unit 150 distributes an output signal of the VCO 140 and provides the distributed output signal to the phase-frequency detection unit 110. That is, the N-distribution unit 150 changes a frequency of an output signal of the VCO 140 to a frequency appropriate to phase comparison of the phase-frequency detection unit 110. For example, the N-distribution unit 150 may be formed similarly to a digital counter.

In order to maintain an output amplitude of the VCO 140 to a desired value, the output controller 160 controls the VCO 140. According to an embodiment of the present disclosure, the output controller 160 outputs control bits to the VCO 140. For example, the output controller 160 may control a regulator or a current source of the VCO 140. When controlling the current source, the control bits may instruct whether to activate each of transistors that supply a current. An example of a detailed configuration of the output controller 160 is shown in FIG. 2.

Figure 2:
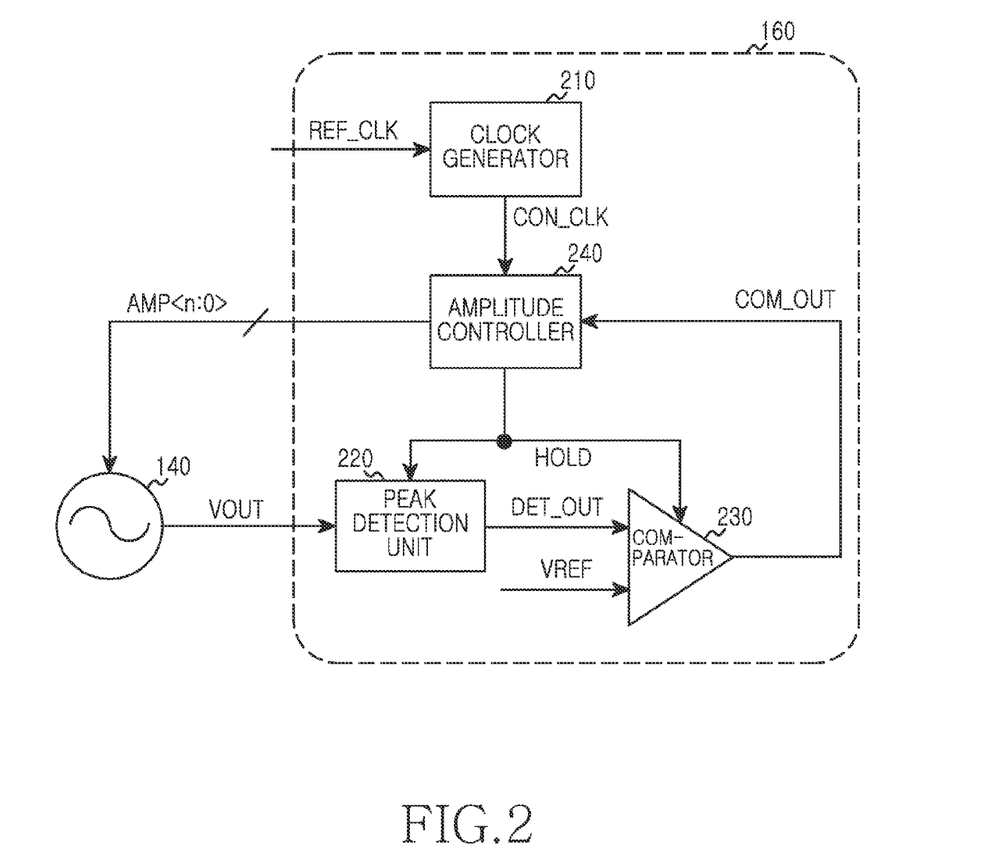
FIG. 2 is a block diagram illustrating a configuration of a control circuit for a Voltage Control Oscillator (VCO) output in an electronic device according to an embodiment of the present disclosure.

FIG. 2 is a block diagram illustrating a configuration of a control circuit for a VCO output in an electronic device according to an embodiment of the present disclosure. FIG. 2 is a block diagram illustrating a configuration of the output controller 160 of FIG. 1.

Referring to FIG. 2, the output controller 160 includes a clock generator 210, a peak detection unit 220, a comparator 230, and an amplitude controller 240.

The clock generator 210 receives a reference clock REF_CLK, and generates a clock CON_CLK to be used for amplitude adjustment of an output signal of the VCO 140. The clock generator 210 provides the clock CON_CLK to the amplitude controller 240.

The peak detection unit 220 detects an amplitude magnitude of an output signal of the VCO 140, or in other words, detects and/or determines a magnitude of the amplitude of the output signal of the VCO 140. The peak detection unit 220 may be a digital component. That is, the peak detection unit 220 may be turned on/off according to the control.

The comparator 230 compares a reference voltage $V_{REF}$ and a detection voltage DET_OUT detected by the peak detection unit 220. The comparator 230 may be a digital component. That is, the comparator 230 may be turned on/off according to the control.

The amplitude controller 240 generates control bits AMP<n:0> that controls the VCO 140 based on COM_OUT according to a comparison result of the comparator 230. The control bits AMP<n:0> controls a regulator or a current source of the VCO. The AMP<n:0> includes the n number of bits.

Further, after the control, i.e., calibration of an amplitude of an output signal of the VCO 140 is complete, the amplitude controller 240 turns off the peak detection unit 220 and the comparator 230. For this, the amplitude controller 240 generates a control signal HOLD that stops operation of the peak detection unit 220 and the comparator 230. Accordingly, the peak detection unit 220 and the comparator 230 stop operation, and current consumption does not occur by the peak detection unit 220 and the comparator 230. For example, when the electronic device is initially driven, i.e., when power is applied to the electronic device, the amplitude controller 240 operates the peak detection unit 220 and the comparator 230, and when the control bits AMP<n:0> is fixed, the amplitude controller 240 turns off the peak detection unit 220 and the comparator 230.

As described above, when the electronic device is initially driven, the calibration is performed and thus a circuit that controls an output amplitude of the VCO may not always operate. Thereby, while the VCO operates, an additional current consumption quantity decreases, and due to a circuit that controls the output amplitude, a phase noise deterioration possibility of the VCO greatly decreases. Further, because most constituent components are formed with a digital circuit, even if a process of the VCO is changed, the constituent components may be easily designed. Further, due to a digital output, a circuit that controls the output amplitude may be easily applied to other circuits as well as to the VCO. Further, by adjusting an output amplitude of the VCO that may be changed according to a process deviation and capacitance of the VCO, a current may be optimized.

Figure 3:
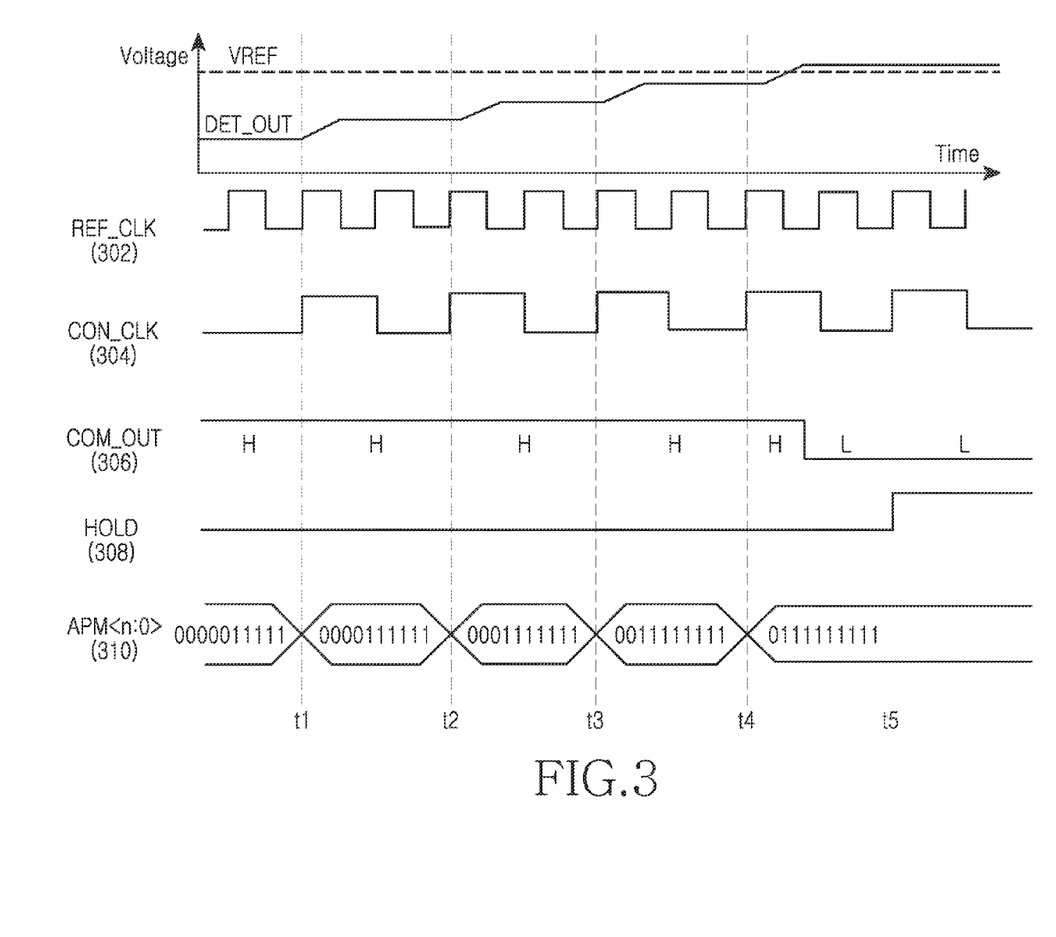
FIG. 3 is a diagram illustrating a change example of signals for controlling a VCO output in an electronic device according to an embodiment of the present disclosure.

FIG. 3 is a diagram illustrating a change example of signals for controlling a VCO output in an electronic device according to an embodiment of the present disclosure. FIG. 3 illustrates a case in which an output amplitude of the VCO is smaller than a target value.

Referring to FIG. 3, an REF_CLK 302 is a reference clock supplied to a circuit that controls an output amplitude of the VCO, and a CON_CLK 304 is a clock of components within a circuit that controls an output amplitude of the VCO generated based on the REF_CLK 302. Referring to FIG. 3, the CON_CLK 304 is generated by dividing a frequency of the REF_CLK 302 into ½. A COM_OUT 306 is a signal representing a comparison result of a reference voltage and a peak voltage detected from an output signal of the VCO, a HOLD 308 is a signal that stops at least one operation among components within a circuit that controls an output amplitude of the VCO, and an AMP 310 is control bits that control an amplitude of the VCO.

Referring to FIG. 3, because an output amplitude of the VCO is smaller than a target value, the COM_OUT 306 maintains a high value. For example, the comparator 230 of FIG. 2 may output a high value. At a time point t1, which is a rising boundary of the CON_CLK 304, because the COM_OUT 306 is a high value, the bit number set to 1 in the AMP 310 increases. At a time point t2, a time point t3, and a time point t4, because the COM_OUT 306 maintains a high value, the bit number continuously set to 1 in the AMP 310 increases.

Thereafter, after the time point t4 and before a time point t5, the COM_OUT 306 is changed to a low value. That is, as the AMP 310 increases, an output amplitude of the VCO continuously increases and thus at a specific time point, an output amplitude of the VCO exceeds the reference voltage and thus the moment that the COM_OUT 306 is changed to a low value occurs. Accordingly, at the time point t5, the HOLD 308 is changed to a high value. Accordingly, operation of at least one component that receives a control of the HOLD 308 is stopped. For example, at least one component may include the peak detection unit 220 and the comparator 230 of FIG. 2. Accordingly, current consumption of the at least one component is reduced.

Figure 4:
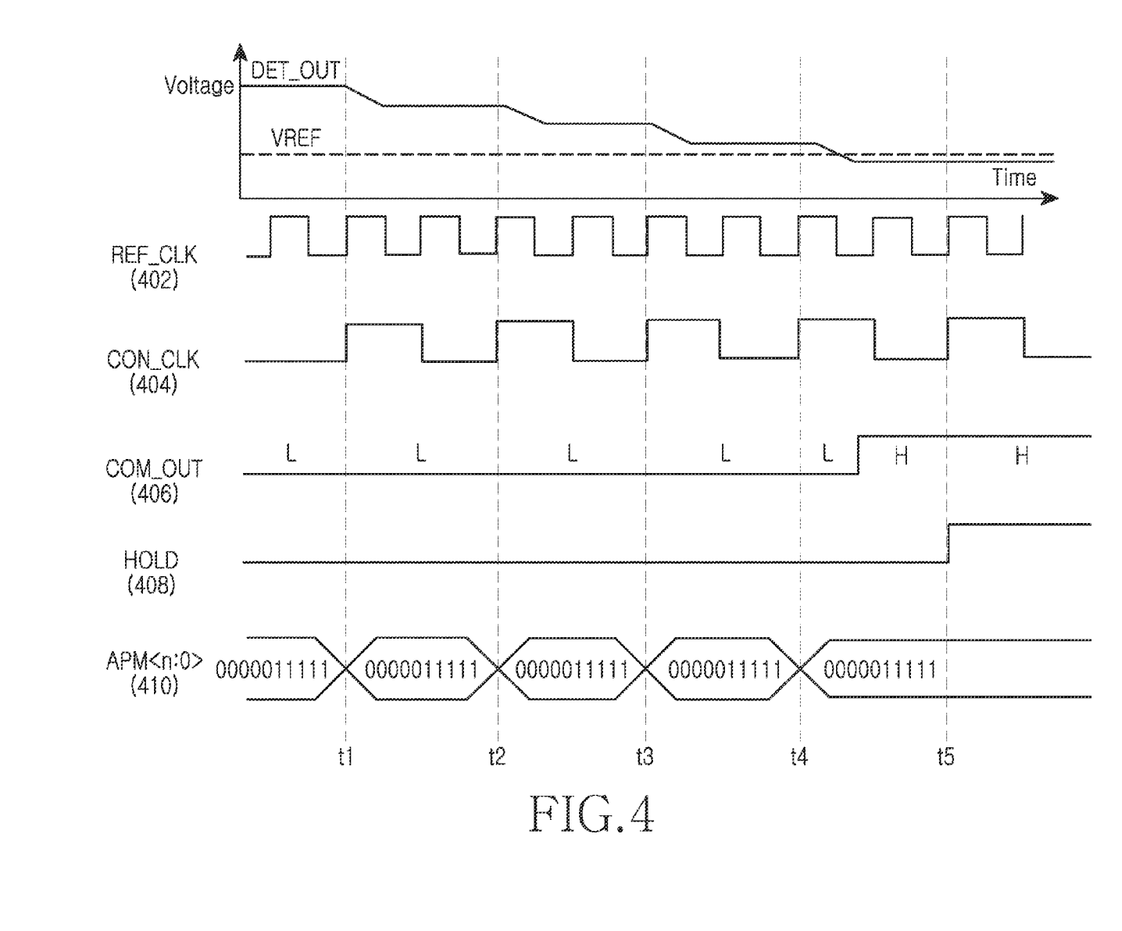
FIG. 4 is a diagram illustrating another change example of signals for controlling a VCO output in an electronic device according to an embodiment of the present disclosure.

FIG. 4 is a diagram illustrating another change example of signals for controlling a VCO output in an electronic device according to an embodiment of the present disclosure. FIG. 4 illustrates a case in which an output amplitude of the VCO is larger than a target value.

Referring to FIG. 4, an REF_CLK 402 is a reference clock supplied to a circuit that controls an output amplitude of the VCO, and a CON_CLK 404 is a clock of components within a circuit that controls an output amplitude of the VCO generated based on the REF_CLK 402. Referring to FIG. 4, the CON_CLK 404 is generated by dividing a frequency of the REF_CLK 402 into ½. A COM_OUT 406 is a signal representing a comparison result of a reference voltage and a peak voltage detected from an output signal of the VCO, a HOLD 408 is a signal that stops operation of at least one of components within circuits that control an output amplitude of the VCO, and an AMP 410 is control bits that control an amplitude of the VCO.

Referring to FIG. 4, because a first output amplitude of the VCO is larger than a target value, the COM_OUT 406 maintains a low value. For example, the comparator 230 of FIG. 2 may output a high value. At a time point t1, which is a rising boundary of the CON_CLK 404, because the COM_OUT 406 is a low value, the bit number set to 1 in the AMP 410 is reduced. At a time point t2, a time point t3, and a time point t4, because the COM_OUT 406 maintains a low value, the bit number continuously set to 1 in the AMP 410 is reduced.

Thereafter, after the time point t4 and before a time point t5, the COM_OUT 406 is changed to a high value. That is, as the AMP 410 increases, an output amplitude of the VCO continuously increases and thus at a specific time point, an output amplitude of the VCO exceeds the reference voltage and thus the moment that the COM_OUT 406 is changed to a high value occurs. Accordingly, at the time point t5, the HOLD 408 is changed to a high value. Accordingly, operation of at least one component that receives a control of the HOLD 408 is stopped. For example, the at least one component may include the peak detection unit 220 and the comparator 230 of FIG. 2. Accordingly, current consumption by the at least one component is reduced.

As described above, a circuit that controls an output amplitude of the VCO outputs control bits, and an output amplitude of the VCO is increased or decreased by the control bits. The control bits may control a current quantity that supplies from a current source of the VCO or may control a regulator of the VCO. Hereinafter, a method of controlling an amplitude by the control bits will be described in detail with reference to the drawings.

Figure 5:
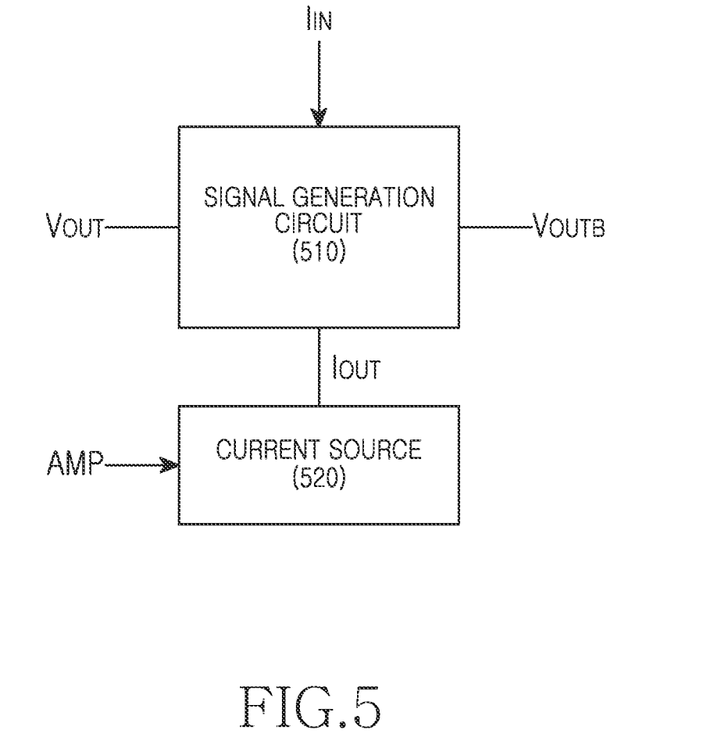
FIG. 5 is a block diagram illustrating an example of a circuit configuration of a VCO according to an embodiment of the present disclosure.

FIG. 5 is a block diagram illustrating an example of a circuit configuration of a VCO according to an embodiment of the present disclosure.

Referring to FIG. 5, the VCO includes a signal generation circuit 510 and a current source 520. The signal generation circuit 510 generates a frequency signal, and the frequency signal is output to a terminal $V_{OUT}$ and a terminal $V_{OUTB}$. The signal generation circuit 510 consumes a current for operation, and the current is input to a terminal $I_{IN}$ and flows to a terminal $I_{OUT}$. The signal generation circuit 510 may be formed, as shown in FIG. 6.

Figure 6:
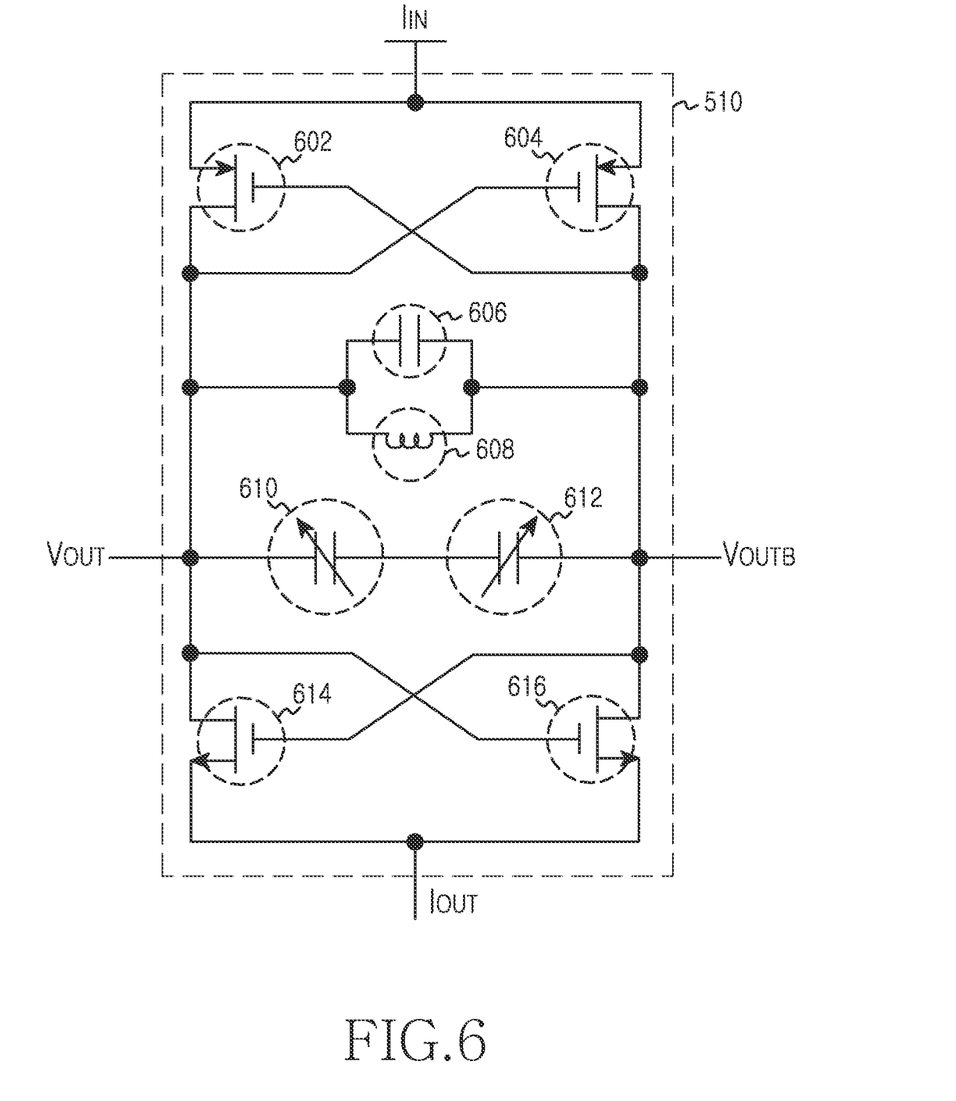
FIG. 6 is a diagram illustrating an example of a circuit configuration of a signal generation circuit of a VCO according to an embodiment of the present disclosure.

FIG. 6 is a diagram illustrating an example of a circuit configuration of a signal generation circuit of a VCO according to an embodiment of the present disclosure.

Referring to FIG. 6, a signal generation circuit 510 includes a first P-type Metal Oxide Semiconductor (PMOS) transistor 602, a second PMOS transistor 604, a capacitor 606, an inductor 608, variable capacitors 610 and 612, a first N-type Metal Oxide Semiconductor (NMOS) transistor 614, and a second NMOS transistor 616. A source of the first PMOS transistor 602 and the second PMOS transistor 604 is connected to a terminal $I_{IN}$, a gate of the first PMOS transistor 602 is connected to a drain of the second PMOS transistor 604, and a gate of the second PMOS transistor 604 is connected to a drain of the first PMOS transistor 602. Both ends of the capacitor 606 and the inductor 608 are connected to a terminal $V_{OUT}$ and a terminal $V_{OUTB}$, respectively, and one ends of the variable capacitors 610 and 612 are connected to each other, and the other ends thereof are connected to the terminal $V_{OUT}$ and the terminal $V_{OUTB}$, respectively. A source of the first NMOS transistor 614 and the second NMOS transistor 616 is connected to the terminal $I_{OUT}$, a gate of the first NMOS transistor 614 is connected to a drain of the second NMOS transistors 616, and a gate of the second NMOS transistor 616 is connected to a drain of the first NMOS transistor 614.

The current source 520 is connected to the terminal $I_{OUT}$ and supplies a current for operation of the signal generation circuit 510. The current source 520 connected to the terminal $I_{OUT}$ is a current source of a case of using a NMOS transistor and has a size smaller than that of a case of using a PMOS transistor, but may generate relatively large noise. The current source 520 adjusts a current quantity supplying according to control bits AMP. For example, the current source 520 may include a plurality of transistors that supply a current, and activate only transistors of the bit number set to a positive value, e.g., 1, included in the control bits AMP, thereby adjusting a supplying current quantity. For example, the current source 520 may be formed, as shown in FIG. 7.

Figure 7:
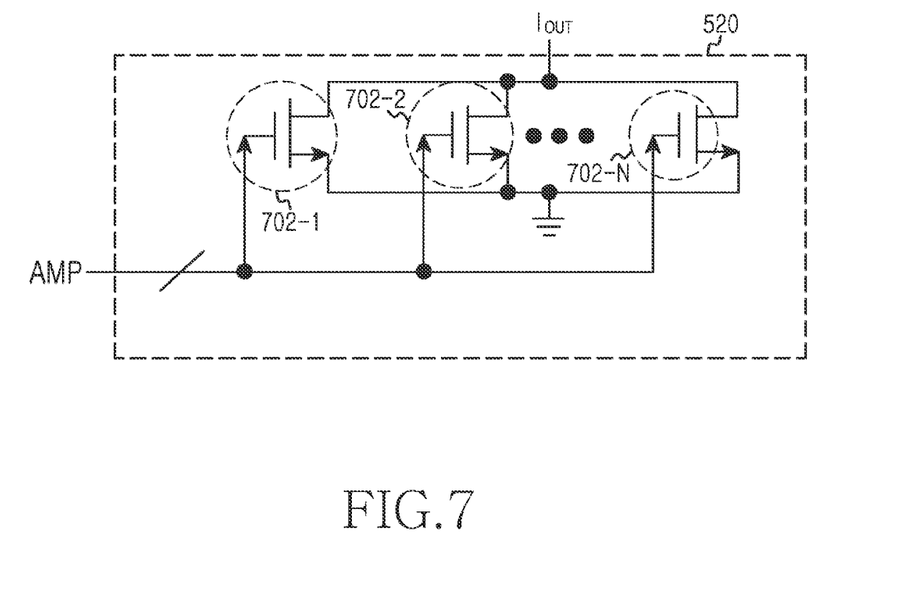
FIG. 7 is a diagram illustrating an example of a circuit configuration of a current source of a VCO according to an embodiment of the present disclosure.

FIG. 7 is a diagram illustrating an example of a circuit configuration of a current source of a VCO according to an embodiment of the present disclosure.

Referring to FIG. 7, the current source 520 includes the N number of NMOS transistors 702-1 to 702-N. Each of the N number of NMOS transistors 702-1 to 702-N supplies a current according to a value of each bit of control bits AMP. Drains of the N number of NMOS transistors 702-1 to 702-N are connected to a terminal $I_{OUT}$, and sources thereof are grounded. Each bit of the control bits AMP is applied to a gate of each of the N number of NMOS transistors 702-1 to 702-N. In this case, only an NMOS transistor that receives a positive value (e.g., 1) supplies a current. That is, as only the entire or a portion instructed by the control bits AMP among the N number of NMOS transistors 702-1 to 702-N connected in parallel supplies a current, an entire supply current quantity of the current source 520 may be adjusted.

Figure 8:
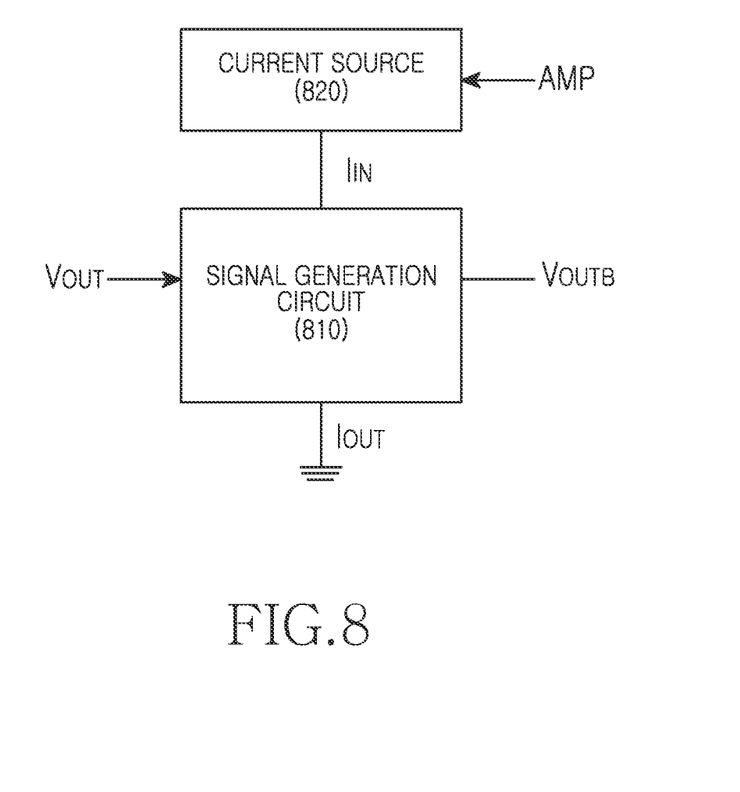
FIG. 8 is a block diagram illustrating another example of a circuit configuration of a VCO according to an embodiment of the present disclosure.

FIG. 8 is a diagram illustrating another example of a circuit configuration of a VCO according to an embodiment of the present disclosure.

Referring to FIG. 8, the VCO includes a signal generation circuit 810 and a current source 820. The signal generation circuit 810 generates a frequency signal, and the frequency signal is output to a terminal $V_{OUT}$ and a terminal $V_{OUTB}$. The signal generation circuit 810 consumes a current for operation, and the current is input to a terminal $I_{IN}$ and flows to a terminal $I_{OUT}$. The signal generation circuit 810 may be formed, as shown in FIG. 6.

The current source 820 is connected to the terminal $I_{IN}$ and supplies a current for operation of the signal generation circuit 810. The current source 820 connected to the terminal $I_{OUT}$ is a current source of a case of using a PMOS transistor and has a size larger than that of a case of using an NMOS transistor, but may generate relatively small noise. The current source 820 adjusts a current quantity supplying according to control bits AMP. For example, the current source 820 may include a plurality of transistors that supply a current and activate only transistors of the bit number set to a positive value, e.g., 1, included in the control bits AMP, thereby adjusting a supplying current quantity. For example, the current source 820 may be formed, as shown in FIG. 9.

Figure 9:
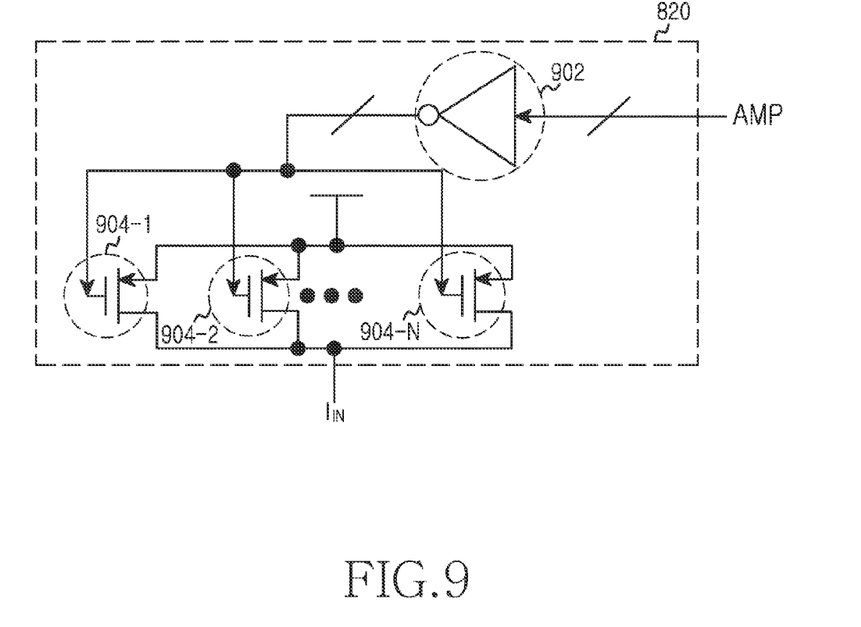
FIG. 9 is a diagram illustrating another example of a circuit configuration of a current source of a VCO according to an embodiment of the present disclosure.

FIG. 9 is a diagram illustrating another example of a circuit configuration of a current source of a VCO according to an embodiment of the present disclosure.

Referring to FIG. 9, the current source 820 includes an inverter 902 and a number N of PMOS transistors 904-1 to 904-N. In order to perform the same control with a value of the same control bits AMP as that of a case of using the PMOS transistor shown in FIG. 7, the inverter 902 inverts a value of the control bits AMP. Each of the N PMOS transistors 904-1 to 904-N supplies a current according to a value of each bit of the inverted control bits AMP. Drains of the N PMOS transistors 904-1 to 904-N are connected to the terminal $I_{IN}$. Each bit of the inverted control bits AMP is applied to a gate of each of the N PMOS transistors 904-1 to 904-N. In this case, only a PMOS transistor that receives a negative value, e.g., 0, supplies a current. That is, as only the entire or a portion instructed by the control bits AMP among the N PMOS transistors 904-1 to 904-N connected in parallel supplies a current, an entire supply current quantity of the current source 820 may be adjusted.

Figure 10:
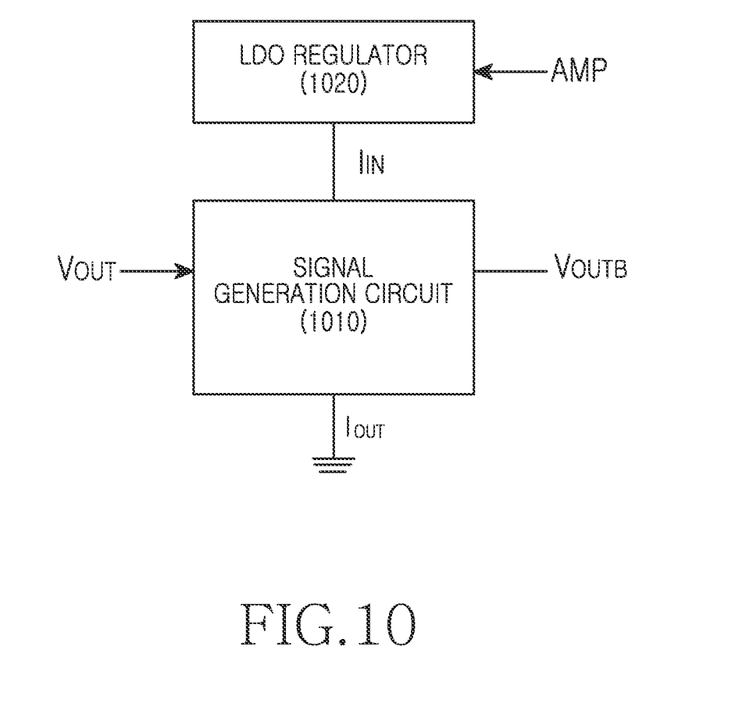
FIG. 10 is a block diagram illustrating another example of a circuit configuration of a VCO according to an embodiment of the present disclosure.

FIG. 10 is a diagram illustrating another example of a circuit configuration of a VCO according to an embodiment of the present disclosure.

Referring to FIG. 10, the VCO includes a signal generation circuit 1010 and a Low Drop Out (LDO) regulator 1020. The signal generation circuit 1010 generates a frequency signal, and the frequency signal is output to a terminal $V_{OUT}$ and a terminal $V_{OUTB}$. The signal generation circuit 1010 consumes a current for operation, and the current is input to a terminal $I_{IN}$ and flows to a terminal $I_{OUT}$. The signal generation circuit 1010 may be formed, as shown in FIG. 6.

The LDO regulator 1020 is connected to the terminal $I_{IN}$ and provides a supply voltage, and in this case, the LDO regulator 1020 adjusts the supply voltage according to the control bits AMP. For example, the LDO regulator 1020 may determine a value of the supply voltage according to the bit number set to a positive value, e.g., 1, included in the control bits AMP. For example, as the bit number set to the positive value increases, a value of the supply voltage may increase.

Figure 11:
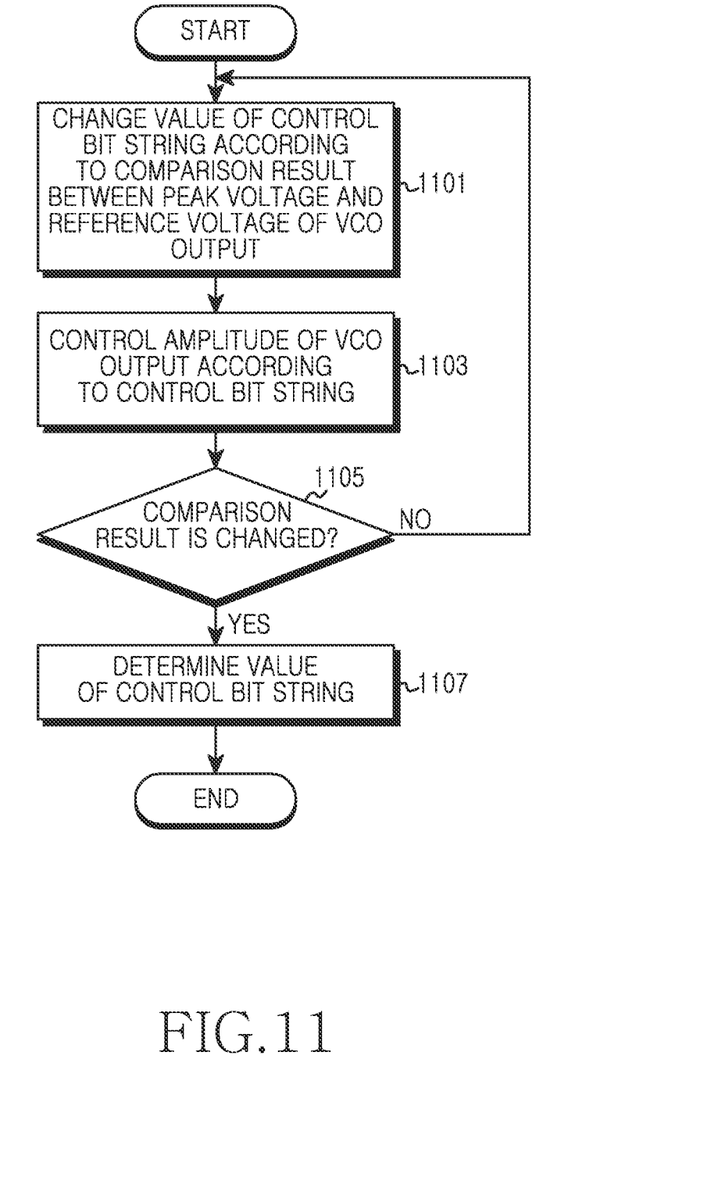
FIG. 11 is a flowchart illustrating an operation procedure of an electronic device according to an embodiment of the present disclosure.

FIG. 11 is a flowchart illustrating an operation procedure of an electronic device according to an embodiment of the present disclosure.

Referring to FIG. 11, the electronic device changes a value of control bits, i.e., a bit string, that control an output amplitude of the VCO, according to a comparison result between a peak voltage and a reference voltage of a VCO output at operation 1101. That is, the control bits have an initial value, and the electronic device changes a value of the control bits according to the comparison result. Here, the value of the control bits is changed to increase or decrease an amplitude. For example, the change may include increase or decrease of the number of bits set to 1. Although not shown in FIG. 11, the electronic device periodically compares the peak voltage and the reference voltage of the VCO output and determines a magnitude thereof.

Thereafter, the electronic device controls an amplitude of the VCO output according to the control bits, i.e., the bit string, at operation 1103. For example, the control bits may control a current source of the VCO or a regulator of the VCO. When controlling the current source, the control bits may instruct whether to activate each of transistors that supply a current. Alternatively, when controlling the regulator, the control bits may instruct a supply voltage of the regulator. That is, the electronic device inputs the control bits to the current source or the regulator. Accordingly, an amplitude of the VCO output increases or decreases.

Thereafter, the electronic device determines whether a comparison result between the peak voltage and the reference voltage of the VCO output is changed at operation 1105. For example, the electronic device may determine whether a situation in which the peak voltage of the VCO output was larger than the reference voltage, but the peak voltage of the VCO output becomes smaller than the reference voltage due to a change of the control bits occurring, or a situation in which the peak voltage of the VCO output was smaller than the reference voltage, but the peak voltage of the VCO output becomes larger than the reference voltage due to a change of the control bits occurring. That is, the electronic device determines whether a time point to determine a value of the control bits arrives.

If a comparison result between the peak voltage and the reference voltage of the VCO output is not changed, i.e., if a magnitude relationship of the peak voltage and the reference voltage of the VCO output is maintained in spite of a change of the control bits, then the process returns to operation 1101. If a comparison result between the peak voltage and the reference voltage of the VCO output is changed, i.e., if a magnitude relationship of the peak voltage and the reference voltage of the VCO output is changed in spite of a change of the control bits, the electronic device determines a value of the control bits, i.e., the bit string, to a present value at operation 1107. That is, the electronic device no longer changes a value of the control bits.

Figure 12:
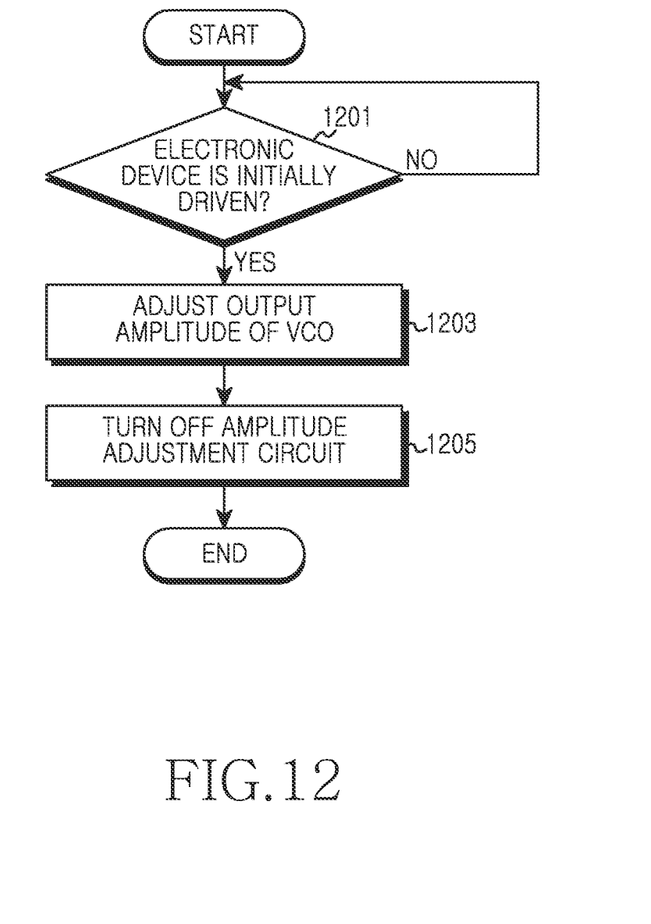
FIG. 12 is a flowchart illustrating an operation procedure of an electronic device according to another embodiment of the present disclosure.

FIG. 12 is a flowchart illustrating an operation procedure of an electronic device according to another embodiment of the present disclosure.

Referring to FIG. 12, the electronic device determines whether the electronic device is initially driven at operation 1201. For example, the electronic device may determine whether power thereof is turned on in a turn off state.

If the electronic device is initially driven, the electronic device adjusts an output amplitude of the VCO at operation 1203. For example, the electronic device may adjust the output amplitude based on a peak voltage of an output of the VCO. Specifically, the electronic device changes a value of control bits that control the output amplitude of the VCO according to a comparison result between the peak voltage and the reference voltage of the VCO output and controls the amplitude of the VCO output according to control bits of the changed value. In a process of repeatedly performing a value change of the control bits and an amplitude control of the VCO output, when the comparison result is changed, for example, a peak voltage of the VCO output was larger than a reference voltage, but when a situation in which a peak voltage of the VCO output becomes smaller than a reference voltage due to a change of the control bits occurs, or a peak voltage of the VCO output was smaller than a reference voltage, but when a situation in which a peak voltage of the VCO output becomes larger than a reference voltage due to a change of the control bits occurs, the electronic device determines a value of the control bits.

Thereafter, the electronic device turns off an amplitude adjustment circuit at operation 1205. In other words, after an output amplitude of the VCO is determined, i.e., after a value of control bits that control an output amplitude of the VCO is determined, the electronic device turns off the amplitude adjustment circuit. That is, the electronic device inactivates at least one component within the amplitude adjustment circuit.

As described above, a VCO amplitude adjustment procedure is performed when the electronic device is initially driven. Specifically, the VCO amplitude adjustment procedure may be performed after a predetermined time after power of the electronic device is first turned on. This is because a predetermined time may be necessary until at least a circuit within the electronic device normally operates. For example, after a circuit requiring compensation of a process deviation and a circuit for compensation of a process deviation become a normal state, the VCO amplitude adjustment procedure may be performed. That is, in the present disclosure, the 'initial driving' includes a state that can normally operate.

As described above, in an embodiment of the present disclosure, when the electronic device is initially driven, the electronic device performs calibration, and a circuit for adjusting an amplitude may not always operate. Thereby, additional current consumption for amplitude adjustment, other than operation of a VCO circuit, may not occur, and a phase noise deterioration possibility of a circuit to be compensated is very low.

In an electronic device, because a calibration procedure for amplitude adjustment of a VCO does not always operate, when the VCO actually operates, additional current consumption is minimized. Further, because a circuit for adjustment of an amplitude is formed using a relatively simple digital circuit, even if a process is changed, the circuit can be easily designed. Further, due to a digital output, the circuit can be easily applied to other circuits as well as the VCO.

Embodiments of the present invention according to the claims and description in the specification can be realized in the form of hardware, software or a combination of hardware and software.

Such software may be stored in a computer readable storage medium. The computer readable storage medium stores one or more programs (software modules), the one or more programs comprising instructions, which when executed by one or more processors in an electronic device, cause the electronic device to perform methods of the present invention.

Such software may be stored in the form of volatile or non-volatile storage such as, for example, a storage device like a Read Only Memory (ROM), whether erasable or rewritable or not, or in the form of memory such as, for example, Random Access Memory (RAM), memory chips, device or integrated circuits or on an optically or magnetically readable medium such as, for example, a Compact Disc (CD), Digital Video Disc (DVD), magnetic disk or magnetic tape or the like. It will be appreciated that the storage devices and storage media are embodiments of machine-readable storage that are suitable for storing a program or programs comprising instructions that, when executed, implement embodiments of the present invention. Embodiments provide a program comprising code for implementing apparatus or a method as claimed in any one of the claims of this specification and a machine-readable storage storing such a program. Still further, such programs may be conveyed electronically via any medium such as a communication signal carried over a wired or wireless connection and embodiments suitably encompass the same.

In the foregoing various embodiments of the present disclosure, constituent components included in the present disclosure were expressed in the singular or the plural according to a suggested embodiment. However, an expression of the singular or the plural is selected appropriate to a situation suggested for convenience of description, and the present disclosure is not limited to a single constituent component or a plurality of constituent components, and constituent components expressed with the plural may be formed in the singular or constituent components expressed with the singular may be formed in the plural.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
    a first circuit configured to output a frequency signal corresponding to a control voltage; and
    a second circuit configured to:
        detect a voltage of the frequency signal,
        compare the voltage of the frequency signal with a reference voltage associated with the frequency signal, and
        generate control bits that control an amplitude of the frequency signal based on the comparison result between the voltage of the frequency signal and the reference voltage,
    wherein the first circuit is further configured to adjust an amplitude of the frequency signal according to the control bits, and
    wherein the second circuit includes at least one digital component for detecting and comparing that is able to be turned on or off.

2. The electronic device of claim 1, wherein the second circuit comprises:
    a detection unit configured to detect the voltage of the frequency signal;
    a comparator configured to compare the voltage of the frequency signal and the reference voltage; and
    a controller configured to generate the control bits according to a comparison result of the comparator.

3. The electronic device of claim 2, wherein each of the detection unit and the comparator is configured to be a digital component that is able to be turned on/off.

4. The electronic device of claim 1, wherein the second circuit is further configured to:
    sequentially change values of the control bits so as to decrease the amplitude while the voltage of the frequency signal is larger than the reference voltage, and
    determine a value of the control bits, if the voltage of the frequency signal is smaller than the reference voltage.

5. The electronic device of claim 1, wherein the second circuit is further configured to:
    sequentially change values of the control bits so as to increase the amplitude while the voltage of the frequency signal is smaller than the reference voltage, and
    determine a value of the control bits, if the voltage of the frequency signal is larger than the reference voltage.

6. The electronic device of claim 1, wherein the control bits instruct whether to activate each of components that supply a current from a current source of the first circuit.

7. The electronic device of claim 1, wherein the control bits instruct a supply voltage of a regulator of the first circuit.

8. The electronic device of claim 1, wherein the first circuit comprises a Voltage Control Oscillator (VCO).

9. The electronic device of claim 1, wherein the second circuit is further configured to be turned off if the amplitude of the frequency signal has a magnitude corresponding to the reference voltage.

10. The electronic device of claim 1, wherein the second circuit is further configured to operate when the electronic device is initially driven.

11. A method for operating an electronic device, the method comprising:
    outputting a frequency signal corresponding to a control voltage;
    detecting a voltage of the frequency signal;
    comparing the voltage of the frequency signal with a reference voltage associated with the frequency signal;
    generating control bits that control an amplitude of the frequency signal based on the comparison result between the voltage of the frequency signal and the reference voltage of the frequency signal; and
    adjusting the amplitude of the frequency signal according to the control bits,
    wherein the detecting and the comparing are performed by a digital component that is able to be turned on or off.

12. The method of claim 11, further comprising:
    sequentially changing a value of the control bits so as to decrease the amplitude while the voltage of the frequency signal is larger than the reference voltage; and
    determining a value of the control bits, if the voltage of the frequency signal is smaller than the reference voltage.

13. The method of claim 11, further comprising:
    sequentially changing a value of the control bits so as to increase the amplitude while the voltage of the frequency signal is smaller than the reference voltage; and
    determining a value of the control bits, if the voltage of the frequency signal is larger than the reference voltage.

14. The method of claim 11, wherein the control bits instruct whether to activate each of components that supply a current from a current source of a circuit that outputs the frequency signal.

15. The method of claim 11, wherein the control bits instruct a supply voltage of a regulator of a circuit that outputs the frequency signal.

16. The method of claim 11, wherein the frequency signal is output by a Voltage Control Oscillator (VCO).

17. The method of claim 11, further comprising:
  turning off a circuit in order to compare the voltage of the frequency signal and the reference voltage if the amplitude of the frequency signal has a magnitude corresponding to the reference voltage.

18. The method of claim 17, wherein the turning off of the circuit in order to compare the voltage of the frequency signal and the reference voltage comprises transmitting a control signal to the circuit to stop operation of a detection unit and a comparator.

19. The method of claim 11, wherein a circuit configured to compare the voltage of the frequency signal and the reference voltage is activated when the electronic device is initially driven.

20. The method of claim 11, wherein the control bits include information used to control at least one of a regulator of a circuit that outputs the frequency signal and a current source of a circuit that outputs the frequency signal.

21. The electronic device of claim 1, wherein the second circuit is configured to generate a control signal for turning off the digital component when an amplitude of the frequency signal has a magnitude corresponding to the reference voltage.

* * * * *